United States Patent
Adiga et al.

(10) Patent No.: US 11,094,873 B2
(45) Date of Patent: Aug. 17, 2021

(54) TRANSMON QUBITS WITH SELF DEFINED JUNCTIONS

(71) Applicant: INTERNATIONAL BUSINESS MACHINES CORPORATION, Armonk, NY (US)

(72) Inventors: Vivekananda Adiga, Ossining, NY (US); David L. Rath, Stormville, NY (US); Martin O. Sandberg, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/684,404

(22) Filed: Nov. 14, 2019

(65) Prior Publication Data

US 2021/0151659 A1     May 20, 2021

(51) Int. Cl.
*H01L 39/24* (2006.01)
*H01L 39/22* (2006.01)
*H01L 39/02* (2006.01)
*H01L 39/12* (2006.01)

(52) U.S. Cl.
CPC ........ *H01L 39/2493* (2013.01); *H01L 39/025* (2013.01); *H01L 39/12* (2013.01); *H01L 39/223* (2013.01)

(58) Field of Classification Search
CPC . H01L 39/2493; H01L 39/025; H01L 39/223; H01L 39/12
See application file for complete search history.

(56) References Cited

U.S. PATENT DOCUMENTS

| 9,385,294 B2 | 7/2016 | Rigetti et al. |
| 10,068,184 B1 | 9/2018 | Hertzberg et al. |
| 10,078,118 B2 * | 9/2018 | Berggren ........... G01R 33/0354 |

(Continued)

FOREIGN PATENT DOCUMENTS

| DE | 4109766 A1 | 10/1992 |
| WO | 2009004609 A2 | 1/2009 |

(Continued)

OTHER PUBLICATIONS

PCT/EP2020/082066 International Search Report dated Jan. 25, 2021.

(Continued)

*Primary Examiner* — Matthew L Reames
(74) *Attorney, Agent, or Firm* — Henry J. Daley; Venable LLP

(57) ABSTRACT

A method of making a Josephson junction in a superconducting qubit includes providing a substrate having a convex structure with a first face and a second face meeting at an edge; depositing a first layer of superconducting material on the first face; oxidizing the first layer to form a layer of oxide material on a surface of the first layer; and depositing a second layer of the superconducting material on the second face. A portion of the second layer is in contact with a portion of the layer of oxide material at or in the vicinity of the edge such that the portion of the layer of oxide material is sandwiched between a portion of the first layer and the portion of the second layer to define a Josephson junction at or in the vicinity of the edge.

22 Claims, 5 Drawing Sheets

(56) References Cited

U.S. PATENT DOCUMENTS

| | | | |
|---|---|---|---|
| 10,256,392 B1 | 4/2019 | Brink et al. | |
| 1,024,711 A1* | 9/2019 | Schoelkopf, III | H01L 39/025 |
| 2015/0069331 A1* | 3/2015 | Faley | H01L 39/225 |
| | | | 257/34 |
| 2015/0372217 A1 | 12/2015 | Schoelkopf, III et al. | |
| 2015/0380631 A1* | 12/2015 | Taylor | H01L 39/225 |
| | | | 257/31 |
| 2018/0358537 A1 | 12/2018 | Brink et al. | |
| 2020/0227636 A1* | 7/2020 | Krogstrup Jeppesen | |
| | | | H01L 29/20 |
| 2020/0328338 A1* | 10/2020 | Adiga | H01L 27/18 |

FOREIGN PATENT DOCUMENTS

| | | |
|---|---|---|
| WO | 2017217959 A1 | 12/2017 |
| WO | 2018004636 A1 | 1/2018 |
| WO | 2018/030977 A1 | 2/2018 |
| WO | 2018/160187 A1 | 9/2018 |

OTHER PUBLICATIONS

PCT/EP2020/082066 Written Opinion dated Jan. 25, 2021.

Koch et al., "Charge insensitive qubit design derived from the Cooper pair box", Phys. Rev. A 76, 042319 (2007), arXiv:cond-mat/0703002v2.

Braumuller, et al., "Concentric transmon qubit featuring fast tunability and an anisotropic magnetic dipole moment", Appl. Phys. Lett. 108, 032601 (2016); arXiv:1509.08014v4 [quant-ph] Feb. 8, 2018.

Gambetta et al., "Superconducting Qubit with Purcell Protection and Tunable Coupling", Phys. Rev. Lett. 106, 030502—Published Jan. 20, 2011, arXiv:1009.4470v1 [cond-mat.mes-hall] Sep. 22, 2010.

Lecocq et al., "Junction fabrication by shadow evaporation without a suspended bridge", Nanotechnology 22 (2011) 315302 (5pp).

* cited by examiner

TRANSMON QUBITS WITH SELF DEFINED JUNCTIONS

BACKGROUND

The currently claimed embodiments of the present invention relate to superconducting qubits, and more specifically, to a method of making a Josephson junction in a superconducting qubit and the superconducting qubit device.

Quantum computation is based on the reliable control of quantum bits (referred to herein throughout as qubits). The fundamental operations required to realize quantum algorithms are a set of single-qubit operations and two-qubit operations which establish correlations between two separate quantum bits. The realization of high fidelity two-qubit operations may be desirable both for reaching the error threshold for quantum computation and for reaching reliable quantum simulations.

The superconducting quantum processor (having one or more superconducting qubits) includes superconducting metals (e.g., Al, Nb, etc.) on an insulating substrate (e.g., Si or high resistivity Si, $Al_2O_3$, etc.). The superconducting quantum processor is typically a planar two-dimensional lattice structure of individual qubits linked by a coupler in various lattice symmetry (for example, square, hexagonal, etc.), and a readout structure located on a flip-chip. The couplers can be made of a capacitor, a resonator, a coil or any microwave component that provides a coupling between qubits.

Conventional methods of fabricating superconducting qubits are based on the standard Josephson junction fabrication using the Dolan or Manhattan methods to form bridges. The above methods require many steps including many lithographic steps and the resulting qubit may be relatively bulky and thus may be sensitive to far field and/or near field coupling to the external environment.

SUMMARY

An aspect of the present invention is to provide a method of making a Josephson junction in a superconducting qubit. The method includes providing a substrate having a convex structure, the convex structure having a first face and a second face meeting at an edge; and depositing a first layer of superconducting material on the first face of the substrate material. The method further includes oxidizing the first layer of superconducting material to form a layer of oxide material on a surface of the first layer of superconducting material; and depositing a second layer of the superconducting material on the second face of the substrate material. A portion of the second layer is in contact with a portion of the layer of oxide material at or in the vicinity of the edge such that the portion of the layer of oxide material is sandwiched between a portion of the first layer of superconducting material and the portion of the second layer of superconducting material to define a Josephson junction at or in the vicinity of the edge.

Another aspect of the present invention is to provide a qubit device. The qubit device includes a substrate having a convex structure, the convex structure having a first face and second face meeting at an edge and forming an angle therebetween. The qubit device further includes a first layer of superconducting material deposited on the first face of the substrate material; and a layer of oxide material on a surface of the first layer of superconducting material. The qubit device also includes a second layer of the superconducting material on the second face of the substrate material. A portion of the second layer is in contact with a portion of the layer of oxide material at or in the vicinity of the edge such that the portion of the layer of oxide material is sandwiched between a portion of the first layer of superconducting material and a portion of the second layer of superconducting material to define a Josephson junction at or in the vicinity of the edge.

Yet another aspect of the present invention is to provide a method of making a Josephson junction in a superconducting qubit. The method includes providing a substrate; depositing superconducting material on a surface of the substrate; and depositing a sacrificial material layer on the superconducting material. The method further includes removing a portion of the sacrificial material layer to uncover a portion of the surface of the substrate to define a qubit pocket; and etching the portion of the surface of the substrate to form a convex shape in the substrate, the convex shape having a first face and a second face meeting at an edge. The method also includes forming a Josephson Junction at or in the vicinity of the edge without applying electron beam or optical beam lithography to connect capacitor pads connected to the Josephson Junction to a plurality of buses.

In an embodiment, forming the Josephson Junction includes depositing a first layer of superconducting material on the first face of the convex shape in the substrate material; oxidizing the first layer of superconducting material to form a layer of oxide material on a surface of the first layer of superconducting material; and depositing a second layer of the superconducting material on the second face of the convex shape in the substrate material. A portion of the second layer is in contact with a portion of the layer of oxide material at or in the vicinity of the edge such that the portion of the layer of oxide material is sandwiched between a portion of the first layer of superconducting material and the portion of the second layer of superconducting material to define the Josephson junction at or in the vicinity of the edge.

In an embodiment, the method further includes defining the plurality of buses and a plurality of readout resonators using lithography; and removing portions of the superconducting material to form the plurality of buses and readout resonators on the substrate. In an embodiment, removing a portion of the sacrificial material layer includes applying a single lithography step.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
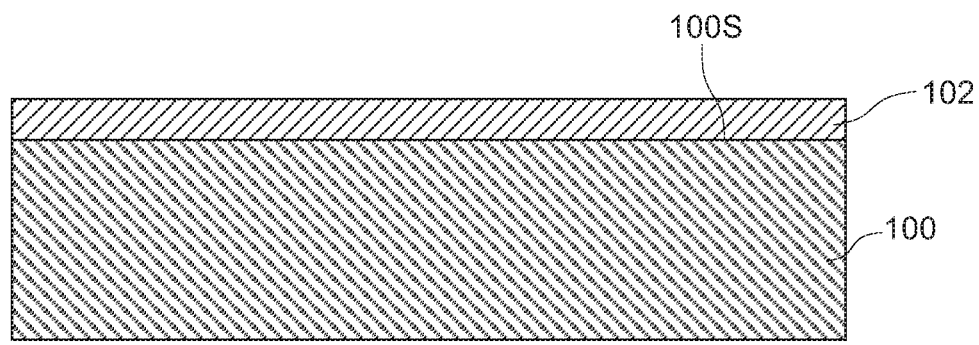
FIG. 1 is a schematic lateral view of a substrate on which is deposited a layer superconducting material, according to an embodiment of the present invention.

In an embodiment, a method of making a Josephson junction for a superconducting qubit device is provided herein. In an embodiment, the method includes providing a substrate 100 and depositing a layer of superconducting material 102 on a surface 100S of the substrate 100. FIG. 1 is a schematic lateral view of the substrate 100 on which is deposited the layer superconducting material 102, according to an embodiment of the present invention. In an embodiment, the substrate 100 can be any non-conductor material including, but not limited to, Silicon (Si) and Sapphire. In an embodiment, the superconducting material 102 can be any superconducting material including, but not limited to, Niobium (Nb), Aluminum (Al), etc.

The method further includes removing portions the superconducting material 102 to uncover a first portion 100A of the surface 100S of the substrate 100 to form a plurality of buses 202 and readout resonators 204 on the substrate. In an embodiment, removal of portions of the layer of superconducting material 102 can be performed by etching (for example, using chemical etching such as acid etching) the portions of the layer of superconducting material 102.

Figure 2A:
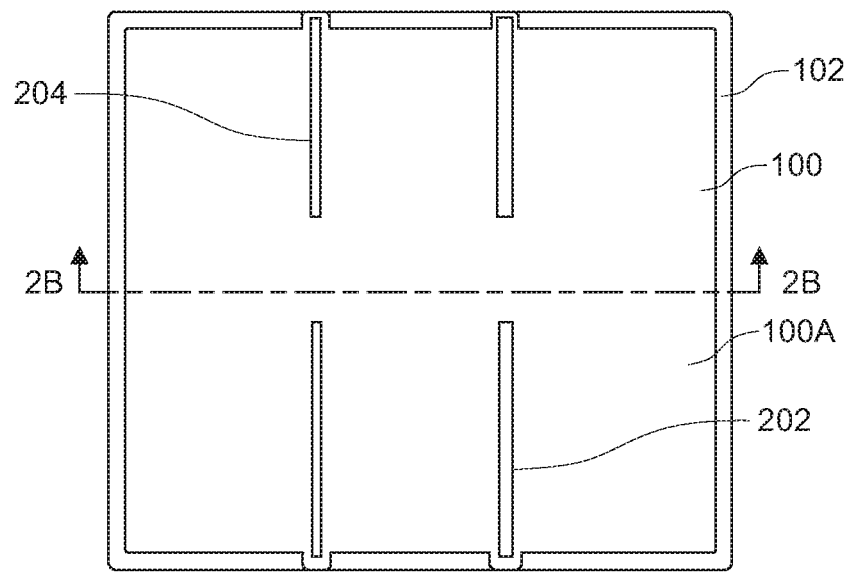
FIG. 2A shows a schematic top view of the substrate with the layer of superconducting material deposited thereon and having some portions of the layer of superconducting material removed, according to an embodiment of the present invention.
Figure 2B:
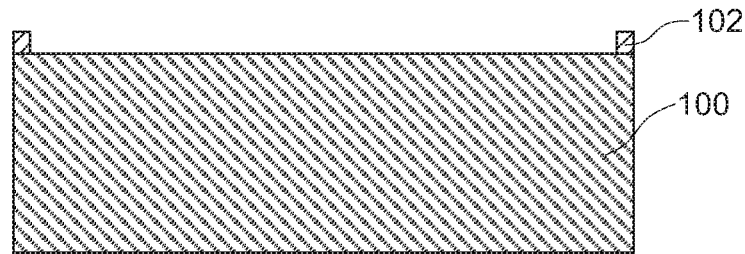
FIG. 2B is a cross-section view, along line 2B-2B shown in FIG. 2A, of the substrate with the layer of superconducting material deposited thereon, according to an embodiment of the present invention.

FIG. 2A shows a schematic top view of the substrate 100 with the layer of superconducting material 102 deposited thereon and having some portions of the layer of superconducting material 102 removed, according to an embodiment of the present invention. FIG. 2B is a cross-section view, along line 2B-2B shown in FIG. 2A, of the substrate with the layer of superconducting material 102 deposited thereon, according to an embodiment of the present invention.

The method further includes depositing a sacrificial material layer 302 on the layer of superconducting material 102 and on the uncovered portion 100A of the surface 100S of the substrate 100. The method also includes applying electron beam or optical beam lithography to expose a portion of the sacrificial material layer 302; and removing the exposed portion of the sacrificial material layer 302 to uncover a portion 100B of the surface 100S of the substrate 100 to define a qubit pocket 304. In an embodiment, removing the exposed portion of the sacrificial material layer 302 comprises applying a single lithography step.

Figure 3A:
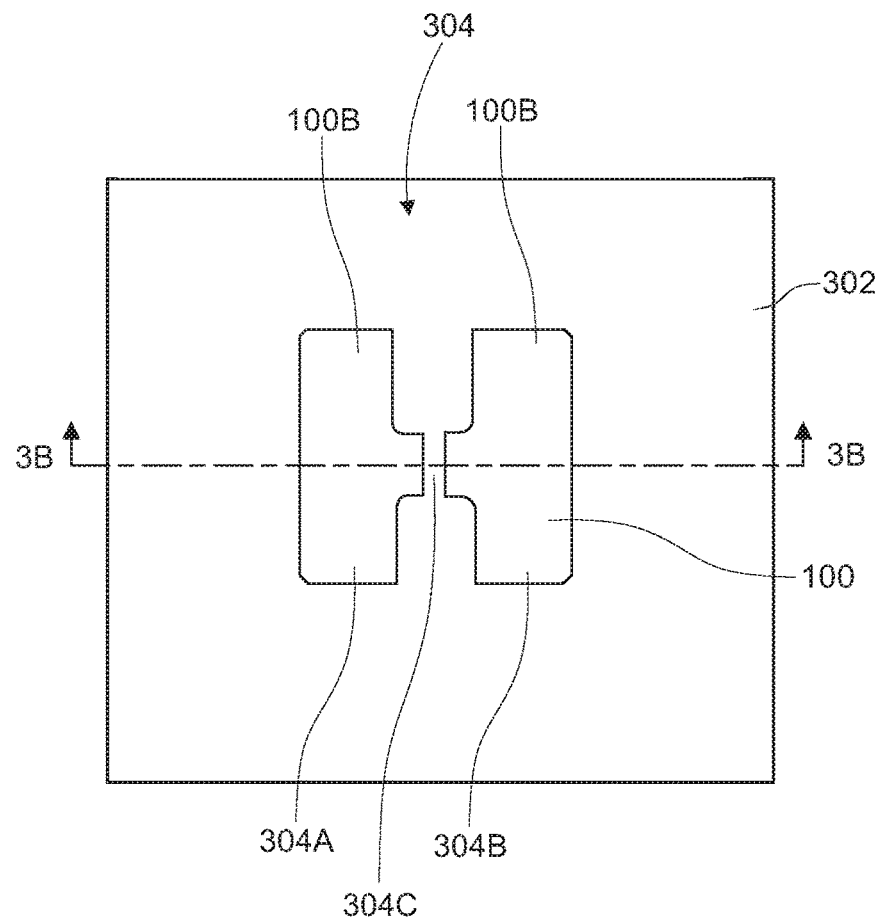
FIG. 3A shows a schematic top view of the substrate having deposited thereon the layer of superconducting material and a layer of sacrificial material layer with a portion of the sacrificial material layer being removed to uncover a portion of a surface of the substrate 100 to define a qubit pocket, according to an embodiment of the present invention.
Figure 3B:
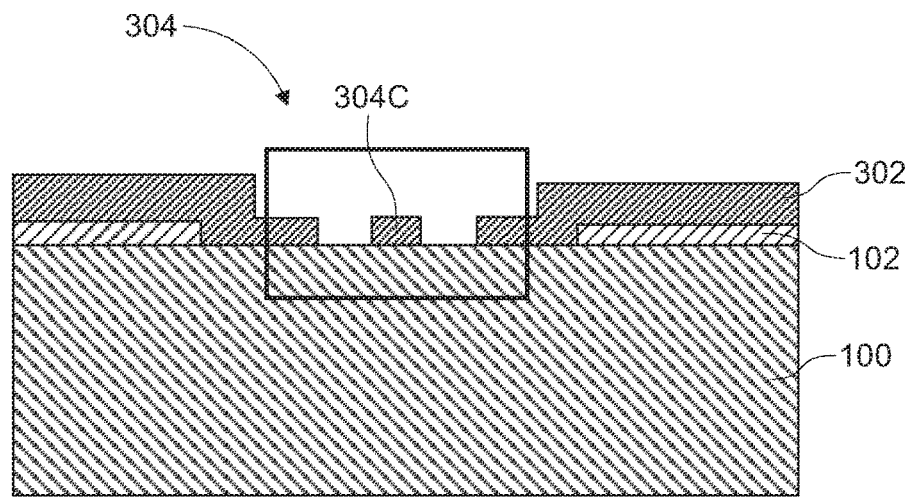
FIG. 3B is a cross-section view, along line 3B-3B shown in FIG. 3A, of the substrate having deposited thereon the layer of superconducting material and the layer of sacrificial material layer with a portion of the sacrificial material layer being removed to uncover a portion of the surface of the substrate to define the qubit pocket, according to an embodiment of the present invention.

FIG. 3A shows a schematic top view of the substrate 100 having deposited thereon the layer of superconducting material 102 and the layer of sacrificial material layer 302 with a portion of the sacrificial material layer 302 being removed to uncover the portion 100B of the surface 100S of the substrate 100 to define the qubit pocket 304, according to an embodiment of the present invention. FIG. 3B is a cross-section view, along line 3B-3B shown in FIG. 3A, of the substrate 100 having deposited thereon the layer of superconducting material 102 and the layer of sacrificial material layer 302 with a portion of the sacrificial material layer 302 being removed to uncover the portion 100B of the surface 100S of the substrate 100 to define the qubit pocket 304, according to an embodiment of the present invention.

In an embodiment, depositing the sacrificial material layer 302 on the layer of superconducting material 102 and on the uncovered portion 100B of the substrate 100 includes depositing Germanium (Ge) on the superconducting material layer 102 and on the uncovered portion 100B of the substrate 100.

As shown in FIG. 3A, in an embodiment, the uncovered portion 102B of the surface 100S of the substrate 100 defining the pocket 304 has two mirror symmetric shapes 304A and 304B. As shown in FIG. 3A, the uncovered portion 100B of the surface 100S of the substrate 100 has an H-like shape. The two mirror symmetric shapes 304A and 304B face each other to form a relatively narrower strip 304C of the sacrificial material layer 302 at a median of the two mirror symmetric shapes 304A and 304B.

Figure 4A:
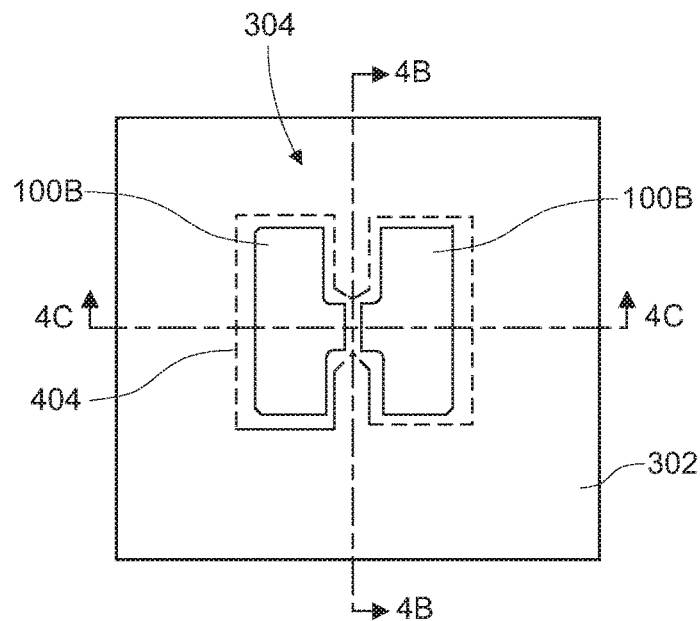
FIG. 4A shows a schematic top view of the substrate with the uncovered portion of the surface of the substrate defining the qubit pocket and the extent of undercut when etching the uncovered portion, according to an embodiment of the present invention.
Figure 4B:
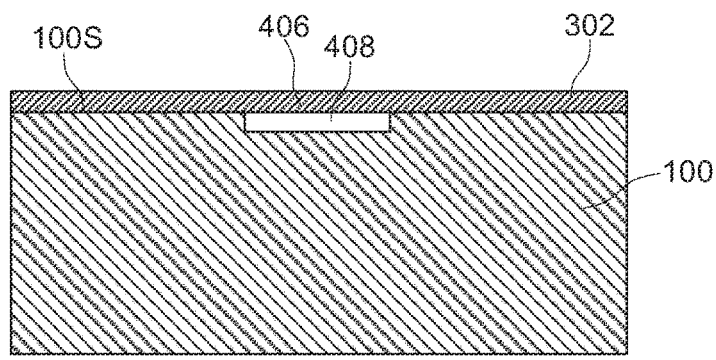
FIG. 4B is a cross-section view, along line 4B-4B shown in FIG. 4A, of the substrate with the uncovered portion of the surface of the substrate defining the qubit pocket and the extent of the undercut when etching the uncovered portion, according to an embodiment of the present invention.
Figure 4C:
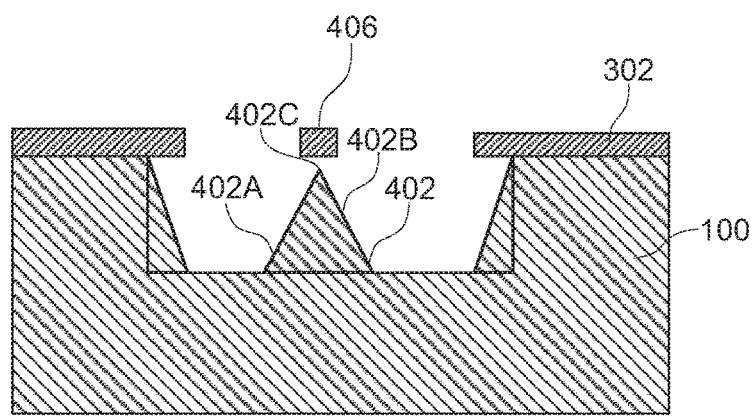
FIG. 4C is a cross-section view, along line 4C-4C shown in FIG. 4A, of the substrate with the uncovered portion of the surface of the substrate defining the qubit pocket and the extent of undercut when etching the uncovered portion, according to an embodiment of the present invention.
Figure 5:
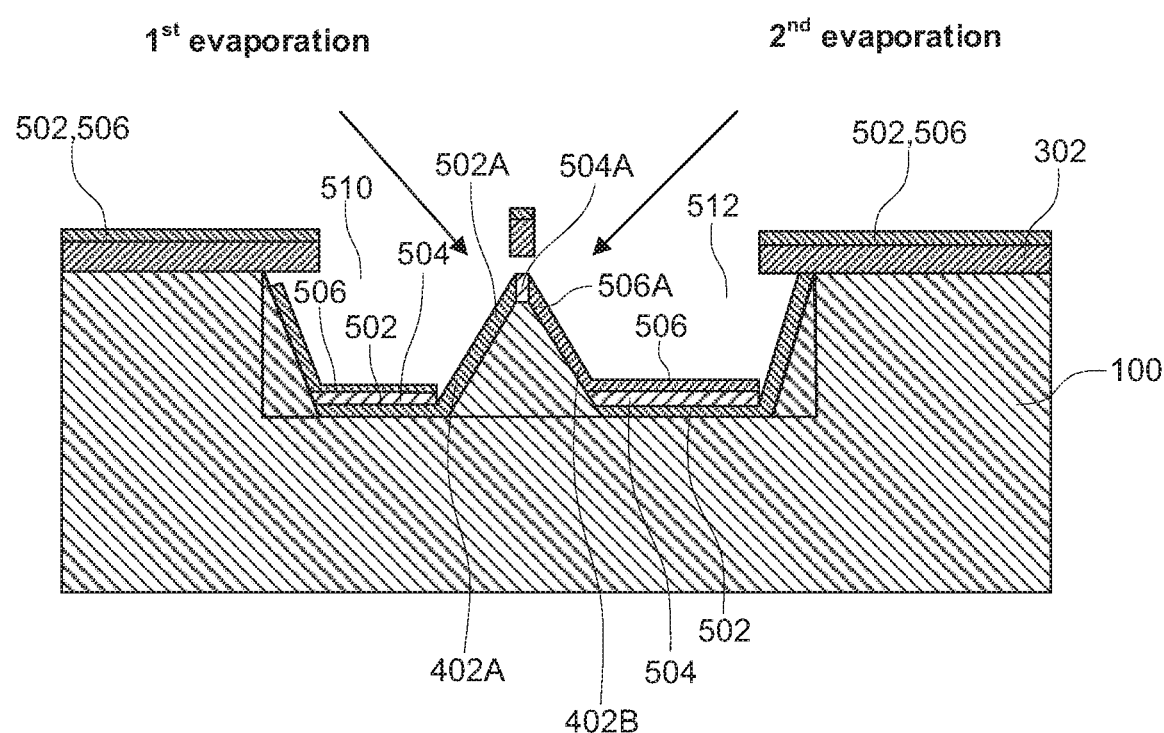
FIG. 5 is a cross-section view of the substrate showing a wedge shape structure, according to an embodiment of the present invention.

In an embodiment, the method further includes etching the portion 100B of the surface 100S of the substrate 100 to form a convex structure 402 in the substrate 100 (shown in FIGS. 4C and 5). In an embodiment, etching the portion 100B includes etching using potassium hydroxide (KOH) or Tetramethyl ammonium hydroxide (TMAH).

FIG. 4A shows a schematic top view of the substrate 100 with the uncovered portion 100B of the surface 100S of the substrate 100 defining the qubit pocket 304 and the extent of undercut 404 when etching the uncovered portion 100B, according to an embodiment of the present invention. In an embodiment, the extent of the undercut 404 created by the etching of the portion 100B is delimited by the dotted lines, as shown in FIG. 4A.

FIG. 4B is a cross-section view, along line 4B-4B shown in FIG. 4A, of the substrate 100 with the uncovered portion 100B of the surface 100S of the substrate 100 defining the qubit pocket 304 and the extent of undercut 404 when etching the uncovered portion 100B, according to an embodiment of the present invention. Along the 4B-4B cross-section shown in FIG. 4B, the sacrificial material layer 302 forms a bridge structure 406 that runs on top pf the surface 100S of the substrate 100 and crosses a void 408 formed after etching the portion 100B of the surface 100S of the substrate 100.

FIG. 4C is a cross-section view, along line 4C-4C shown in FIG. 4A, of the substrate 100 with the uncovered portion 100B of the surface 100S of the substrate 100 defining the qubit pocket 304 and the extent of undercut 404 when etching the uncovered portion 100B, according to an embodiment of the present invention. Along the 4C-4C cross-section shown in FIG. 4C, the sacrificial material layer 302 forms the bridge structure 406 that runs on top pf the surface 100S of the substrate 100 and on top of the formed convex structure 402 after etching the portion 100B of the surface 100S of the substrate 100.

In an embodiment, the convex structure 402 can have for example a wedge shape or a triangular prism shape. In general, the convex structure 402 has a first face 402A and a second face 402B meeting at an edge 402C. The two faces 402A and 402B define an angle (e.g., an acute angle less than 90 deg.) at the edge 402C. In an embodiment, as shown in FIG. 4C, a cross-section of the convex structure along the line 4C-4C has a triangular shape. In an embodiment, the first face 402A and the second face 402B are formed in a (111) crystal plane of the substrate 100.

FIG. 5 is a cross-section view of the substrate showing the wedge shape structure, according to an embodiment of the present invention. In an embodiment, the method further includes depositing a first layer of superconducting material 502 on the first face 402A of the convex structure 402 in the substrate 100. In an embodiment, the first layer of superconducting material 502 can be deposited by using a first evaporation, as illustrated for example in FIG. 5. In an embodiment, the first layer of superconducting material 502 is also deposited in a first trench 510 and second trench 512 formed during the etching of the substrate 100.

The method further includes, after depositing the first layer of superconducting material 502, oxidizing the first layer of superconducting material 502 to form a layer of oxide material 504 on a surface of the first layer of superconducting material 502. The layer of oxide material 504 forms where the first layer of superconducting material 502 is not in contact with the substrate 100. In particular, an end portion 502A of the first layer of superconducting material 502 near the edge 402C is also oxidized and a portion 504A of the oxide layer 504 forms on the end portion 502A of the first layer of superconducting material 502. In addition, the oxide layer 504 also forms at the bottom of the trenches 510 and 512 on top of the first layer of superconducting material 502.

The method also includes depositing a second layer of the superconducting material 506 on the second face 402B of the convex structure 402. In an embodiment, the second layer of superconducting material 506 can be deposited by using a second evaporation, as illustrated for example in FIG. 5. A portion 506A of the second layer of superconducting material 506 is deposited in contact with the portion 504A of the layer of oxide material 504 at or in the vicinity of the edge 402C such that the portion of the layer of oxide material 504A is sandwiched between the portion 502A of the first layer of superconducting material 502 and the portion 506A of the second layer of superconducting material 506 to define a Josephson junction (JJ) at or in the vicinity of the edge 402C. In an embodiment, the oxide material layer 504 is selected from the group consisting of Aluminum oxide and Niobium oxide. In an embodiment, the second layer of superconducting material 506 is also deposited inside the trenches 510 and 512 on top of the oxide layer 504.

In an embodiment, the first layer of superconducting material 502 and the second layer of superconducting material 506 can be from a same or a different superconducting material. For example, in one embodiment, the first layer of superconducting material 502 and the second layer of superconducting material 506 can be both Aluminum layers. In another embodiment, the first layer of superconducting material 502 can be an Aluminum layer and the second layer of superconducting material can be a Niobium layer. In addition, the first layer of superconducting material 502 and/or the second layer of superconducting material 506 can be the same or different from the layer of superconducting material 102.

Figure 6A:
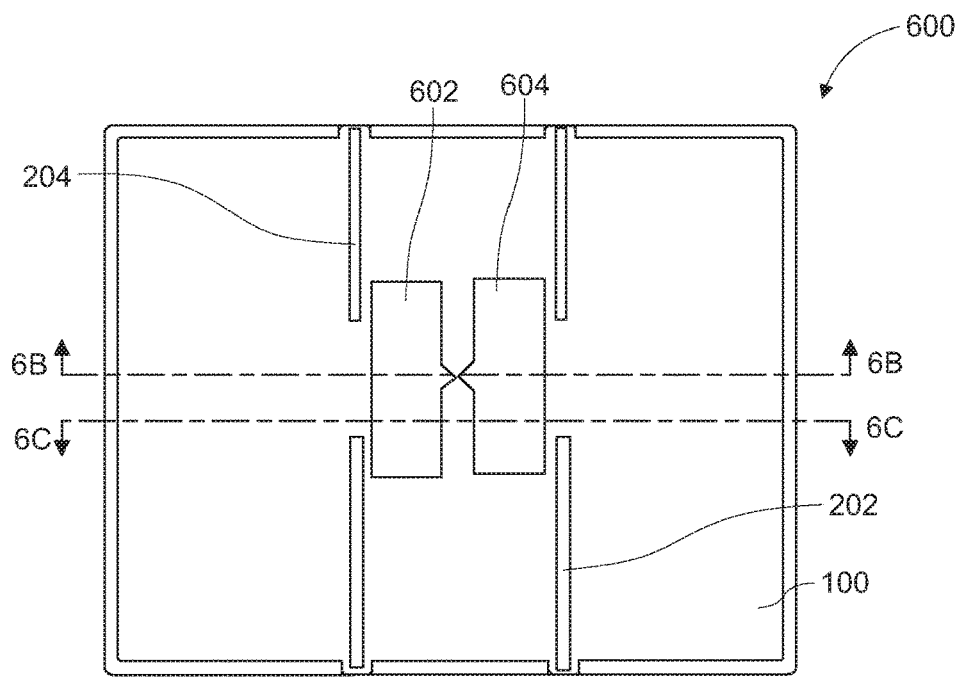
FIG. 6A is a top view of a formed qubit device including a Josephson junction (JJ) and buses and resonators, according to an embodiment of the present invention.
Figure 6B:
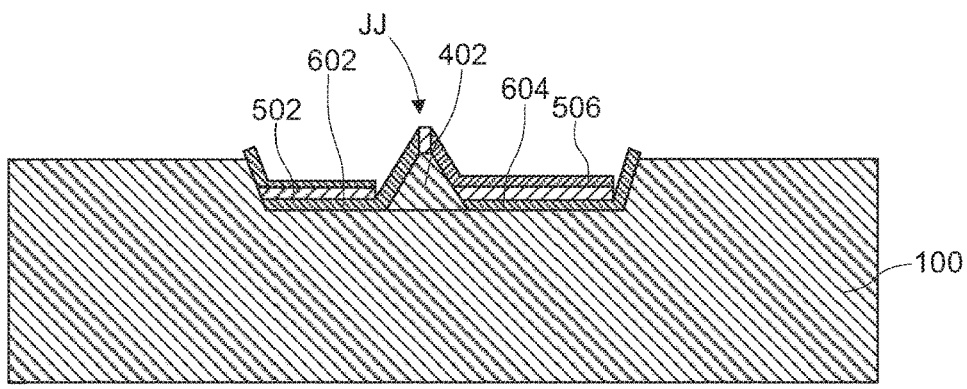
FIG. 6B is a cross-section view of the formed qubit device, along line 6B-6B shown in FIG. 6A, according to an embodiment of the present invention.

The method further includes removing remaining sacrificial material layer (e.g., Germanium) 302 to form the Josephson Junction (JJ) and the qubit device 600. FIG. 6A is a top view of the formed qubit device 600 including the Josephson junction (JJ) and the buses and resonators 202 and 204, according to an embodiment of the present invention. FIG. 6B is a cross-section view of the formed qubit device 600, along line 6B-6B shown in FIG. 6A, according to an embodiment of the present invention, FIG. 6C is a cross-section view of the formed qubit device 600 along line 6C-6C shown in FIG. 6A, according to an embodiment of the present invention.

Figure 6C:
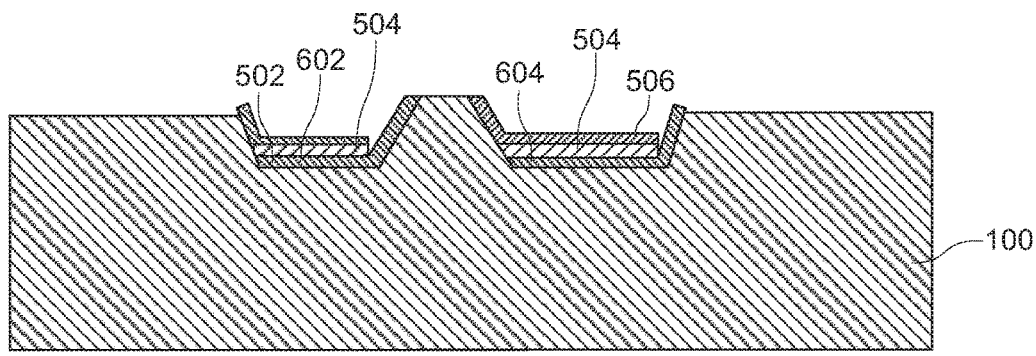
FIG. 6C is a cross-section view of the formed qubit device, along line 6C-6C shown in FIG. 6A, according to an embodiment of the present invention.

As shown in FIGS. 6A-6C, the qubit device 600 includes the substrate 100 having the convex structure 402, the convex structure 402 having the first face 402A and the second face 402B meeting at the edge 402C and forming an angle therebetween. The qubit device 600 also includes the first layer of superconducting material 502 deposited on the first face 402A of the convex structure 402 of the substrate material 100. The qubit device 600 also includes a layer of oxide material 504 on the surface of the first layer of superconducting material 502. The qubit device 600 also includes the second layer of the superconducting material 506 on the second face of the substrate material 402B. The portion 506A of the second layer of superconducting material 506 is deposited in contact with the portion 504A of the layer of oxide material 504 at or in the vicinity of the edge 402C such that the portion of the layer of oxide material 504A is sandwiched between the portion 502A of the first layer of superconducting material 502 and the portion 506A of the second layer of superconducting material 506 to define a Josephson junction (JJ) at or in the vicinity of the edge 402C.

In an embodiment, the first layer of superconducting material 502 and the second layer of superconducting material 506 that are also deposited in the first trench 510 define the first capacitor pad 602 to electrically connect to the Josephson junction (JJ), as shown in FIGS. 6A and 6B. The first layer of superconducting material 502 and the second layer of superconducting material 506 that are also deposited in the second trench 512 define the second capacitor pad 604 to electrically connect to the Josephson junction (JJ), as shown in FIGS. 6A and 6B. In an embodiment, the Josephson junction (JJ) is formed at or in the vicinity of the edge 402C without applying electron beam or optical beam lithography to connect capacitor pads 602 and 604 to the Josephson junction (JJ) and to the plurality of buses 202 and/or the plurality of readout resonators 204. As described in the above paragraphs, the plurality of buses 202 and the plurality of readout resonators 204 are defined using lithography and portions of the superconducting material layer 102 are removed to form the plurality of buses and readout resonators 202 and 204 on the substrate 100. Gaps between the first capacitor pad 602 and the plurality of buses 202 and readout resonators 204 and gaps between the second capacitor pad 604 and the plurality of buses 202 and readout resonators 204 define the coupling capacitors to couple microwave energy to the Josephson junction (JJ).

In conventional methods, ion milling is used to open up naturally formed oxide on capacitor pad material so as to connect the Josephson junction to the capacitor pad material. In conventional methods, this ion milling step is typically performed before junction metal evaporation and in situ. In contrast, in some embodiments of the present invention, the capacitor pads 602 and 604 and the Josephson junction (JJ) of the qubit are formed in a same step. As a result, the use of ion milling to open up the naturally formed oxide on capacitor pad material to connect the Josephson junction to the capacitor pads is not needed. Indeed, the ion milling step can damage the substrate 100 (e.g., silicon) in exposed regions and thus can negatively affect coherence. Therefore, by using the methods according to some embodiments of the present invention, this problem can be avoided and thus this challenge can be overcome.

In addition, the methods according to some embodiments of the present invention allow for the fabrication of a qubit device 600 that substantially reduces far field and near field coupling to the external environment. In addition, the overall size of the resulting qubit device 600 is also reduced thus providing a compact qubit device which thereby reduce losses and allows for the assembly of 2D lattices of qubits with symmetry.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of making a Josephson junction in a superconducting qubit comprising:
   providing a substrate having a convex structure, the convex structure having a first face and a second face meeting at an edge;
   depositing a first layer of superconducting material on the first face of the substrate material;
   oxidizing the first layer of superconducting material to form a layer of oxide material on a surface of said first layer of superconducting material; and
   depositing a second layer of the superconducting material on the second face of the substrate material, wherein a portion of said second layer is in contact with a portion of the layer of oxide material at or in the vicinity of said edge such that the portion of the layer of oxide material is sandwiched between a portion of the first layer of superconducting material and the portion of the second layer of superconducting material to define a Josephson junction at or in the vicinity of said edge.

2. The method according to claim 1, further comprising:
   depositing superconducting material on a surface of the substrate; and
   removing portions of the superconducting material to uncover a first portion of the surface of the substrate to form a plurality of buses and readout resonators on the substrate.

3. The method according to claim 2, further comprising:
   depositing a sacrificial material layer on the superconducting material and on the uncovered first portion of the surface of the substrate;
   applying electron beam or optical beam lithography to expose a portion of the sacrificial material layer; and
   removing the exposed portion of the sacrificial material layer to uncover a second portion of the surface of the substrate to define a qubit pocket.

4. The method according to claim 3, wherein depositing said sacrificial material layer on the superconducting material and on the uncovered first portion of the substrate comprises depositing Germanium (Ge) on the superconducting material and on the uncovered first portion of the substrate.

5. The method according to claim 3, wherein the uncovered second portion of the surface of the substrate has two mirror symmetric shapes.

6. The method according to claim 5, wherein the uncovered second portion of the surface of the substrate has a H-like shape.

7. The method according to claim 5, wherein the two mirror symmetric shapes of the uncovered second portion of the surface of the substrate are separated by a narrower strip of the sacrificial material layer at a median of said two mirror symmetric shapes.

8. The method according to claim 3, further comprising:
   etching the second portion of the surface of the substrate to form the convex shape in the substrate.

9. The method according to claim 8, wherein etching the second portion of the surface of the substrate comprises etching using potassium hydroxide (KOH) or Tetramethylammonium hydroxide (TMAH).

10. The method according to claim 8, further comprising removing remaining sacrificial material layer to form the Josephson Junction.

11. The method according to claim 1, wherein the first face and the second face are formed in a (111) crystal plane of the substrate.

12. The method according to claim 1, wherein the substrate comprises Silicon (Si).

13. The method according to claim 1, wherein the superconducting material is selected from the group consisting of Aluminum (Al) and Niobium (Nb).

14. The method according to claim 1, wherein the oxide material is selected from the group consisting of Aluminum oxide and Niobium oxide.

15. A qubit device, comprising:
   a substrate having a convex structure, the convex structure having a first face and second face meeting at an edge and forming an angle therebetween;
   a first layer of superconducting material deposited on the first face of the substrate material;
   a layer of oxide material on a surface of said first layer of superconducting material; and
   a second layer of the superconducting material on the second face of the substrate material,
   wherein a portion of said second layer is in contact with a portion of the layer of oxide material at or in the vicinity of said edge such that the portion of the layer of oxide material is sandwiched between a portion of the first layer of superconducting material and a portion of the second layer of superconducting material to define a Josephson junction at or in the vicinity of said edge.

16. The qubit device according to claim 15, wherein the substrate comprises Silicon (Si).

17. The qubit device according to claim 15, wherein the superconducting material is selected from the group consisting of Aluminum (Al) and Niobium (Nb).

18. The qubit device according to claim 15, wherein the oxide material is selected from the group consisting of Aluminum oxide and Niobium oxide.

19. A method of making a Josephson junction in a superconducting qubit comprising:
   providing a substrate;
   depositing superconducting material on a surface of the substrate;
   depositing a sacrificial material layer on the superconducting material;
   removing a portion of the sacrificial material layer to uncover a portion of the surface of the substrate to define a qubit pocket;
   etching the portion of the surface of the substrate to form a convex shape in the substrate, the convex shape having a first face and a second face meeting at an edge; and
   forming a Josephson Junction at or in the vicinity of the edge without applying electron beam or optical beam lithography to connect capacitor pads connected to the Josephson Junction to a plurality of buses.

20. The method according to claim 19, wherein forming the Josephson Junction comprises:
   depositing a first layer of superconducting material on the first face of the convex shape in the substrate material;
   oxidizing the first layer of superconducting material to form a layer of oxide material on a surface of said first layer of superconducting material; and
   depositing a second layer of the superconducting material on the second face of the convex shape in the substrate material,
   wherein a portion of said second layer is in contact with a portion of the layer of oxide material at or in the vicinity of said edge such that the portion of the layer of oxide material is sandwiched between a portion of the first layer of superconducting material and the portion of the second layer of superconducting material to define the Josephson junction at or in the vicinity of said edge.

21. The method according to claim 19, further comprising:
   defining the plurality of buses and a plurality of readout resonators using lithography;
   removing portions of the superconducting material to form the plurality of buses and readout resonators on the substrate.

22. The method according to claim 19, wherein removing a portion of the sacrificial material layer comprises applying a single lithography step.

* * * * *